US006291940B1

(12) United States Patent
Scholte Van Mast

(10) Patent No.: US 6,291,940 B1
(45) Date of Patent: Sep. 18, 2001

(54) BLANKER ARRAY FOR A MULTIPIXEL ELECTRON SOURCE

(75) Inventor: Bart Scholte Van Mast, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/590,945

(22) Filed: Jun. 9, 2000

(51) Int. Cl.$^7$ .................................................. H01J 7/24

(52) U.S. Cl. ................ 315/111.81; 315/366; 313/336; 250/492.23; 250/492.3

(58) Field of Search .................. 315/111.21–111.81, 315/366; 313/336, 351, 421; 250/492.2, 492.21–492.23, 492.3

(56) References Cited

U.S. PATENT DOCUMENTS

| | | | |
|---|---|---|---|
| 4,684,848 | 8/1987 | Kaufman et al. | 315/111.81 |
| 4,686,554 * | 8/1987 | Ohmi et al. | 357/30 |
| 5,003,178 | 3/1991 | Livesay | 250/492.3 |
| 5,363,021 * | 11/1994 | MacDonald | 315/366 |
| 5,659,329 | 8/1997 | Yamanobe et al. | 345/74 |
| 5,752,142 | 5/1998 | Staples et al. | 399/241 |
| 5,876,576 | 3/1999 | Fu | 204/298.2 |
| 6,166,387 * | 12/2000 | Muraki et al. | 250/492.2 |

OTHER PUBLICATIONS

Baltakov, et al., "Use of a high–voltage glow discharge in an electron gun", Sov. Phys. Tech. Phys., vol. 21, No. 10, pp. 1290–1291 (Oct. 1976).

Bauer, et al., "High current plasma based electron source", Appl. Phys. Lett. 57, No. 5, pp. 434–436, (Jul. 30, 1990).

Bayless, "Plasma–cathode electron gun", Rev. Sci. Instrm., vol. 46, No. 9, pp. 1158–1160 (Sep. 1975).

Belyuk, et al., "Emitter and beam parameters of a plasma electron source with a high brightness", Sov. Phys. Tech. Phys., vol. 11, pp. 1427–1428 (Nov. 1979).

Belyuk, et al., "Operation of a plasma electron source over a broad range of working–gas pressure", Sov. Phys. Tech. Phys. No. 25, pp. 124–125 (Jan. 1980).

Bevov, et al., "Pulsed electron sources with a plasma electron emitter", Sov. Phys. Tech. Phys. 28 (4), pp. 412–413 (Apr. 1983).

Bowden, et al., "Comparison of electron property measurements in an inductively coupled plasma made by Langmuir probe and laser Thompson scattering techniques", J. Vac. Sci. Technol. 17(2), pp. 493–499 (Mar./Apr. 1999).

(List continued on next page.)

*Primary Examiner*—Haissa Philogene

(57) ABSTRACT

A multipixel electron emission source is generated by separating a point electron source from a plasma region. The point electron source produces an electron beam that is passed through the plasma region. The plasma region diffuses the electron beam thereby producing electrons with uniform energy. Moreover, the maximum current of the device is advantageously controlled by the maximum electron current produced by the point electron source and not the characteristics of the plasma and wall interactions as found in conventional devices. The electrons are then pulled out of the plasma region by an aperture grid that is also used as a blanking array. A focusing chamber is positioned down stream of the plasma region and aperture grid. The aperture grid includes a base electrode and a blanker electrode, which is isolated from the base electrode. The base electrode is held at a potential. In the off state, the blanker electrode is floating permitting the blanker electrode to become negatively charged from the electron stream. Once negatively charged, the blanker electrode pinches off the electron stream. In the on state, the blanker electrode is switchably coupled to the base electrode which drains the negative charge and permits the electron stream to pass. The aperture grid may be an integrated blanking and switching device.

28 Claims, 7 Drawing Sheets

OTHER PUBLICATIONS

Fedorov, "Electron Source in a plasma", Sov. Phys. Tech. Phys. 25(7), pp. 808–809, (Jul. 1980).

Hori, et al., "Measurements of electron temperature, electron density and neutral density in a radio–frequency inductively coupled plasma", 14(1), pp. 144–150 (Jan./Feb. 1996).

Ivanov, et al., "Electron temperature in heavy inert gas plasmas at low etching fields", Sov. Phys. Tech. Phys. 31(10), pp. 1202–1204, (Oct. 1986).

Kaufman, "Broad–beam electron source", J. Vac. Sci. Technol. A 3(4), pp. 1774–1778, (Jul./Aug. 1985).

Kim, et al., "Dually driven radio frequency plasma simulation with a three moment model", J. Vac. Sci Technol. A 16(4), pp. 2162–2172 (Jul./Aug. 1998).

Kolokolov, et al., "Electron energy distribution function in a afterglow plasma with a radial electric field", Sov. Phys. Tech. Phys. 31(9), pp. 1033–1036 (Sep. 1986).

Kushner, et al., "Electron–beam controlled radio frequency discharges for plasma processing", J. Vac. Sci. Technolo. A.14(4), pp. 2094–2101, (Jul./Aug. 1996).

Lai, et al., "Magnetically confined inductively coupled plasma etching reactor", J. Vac. Sci Technol. A 13 (4), pp. 2086–2091 (Jul./Aug. 1995).

Lamm, "Observations of standing waves on an inductive plasma coil modeled as a uniform transmission line", J. Vac. Sci. Technol. A 15(5), pp. 2615–2622, (Sep./Oct. 1997).

Okada, et al., "Langmuir probe measurements in a low pressure inductively coupled plasma used for diamond deposition", J. Vac. Technol. A 17(3), pp. 721–725 (May/Jun. 1999).

Stevens, "Helicon plasma source excited by a flat spiral coil", J. Vac. Sci. Technol. A13(5), pp. 2476–2482 (Sep./Oct. 1995).

Tulip, "High–energy electron gun with gas amplification of the filament current", Applied Physics Letters, vol. 29, No. 11, pp. 692–694 (Dec. 1976).

Verhey, et al., "Low–energy broad area electron beam for etching microelectronic materials", J. Appl. Phys., 62 (7), pp. 3001–3005 (Oct. 1987).

Voitik, et al., "Energy distribution and rate constants for electron collisions in discharges in $AR/Kr/F_2$ mixtures", Sov. Phys. Tech. Phys. 24(10), pp. 1272–1273 (Oct. 1979).

* cited by examiner

BLANKER ARRAY FOR A MULTIPIXEL ELECTRON SOURCE

FIELD OF THE INVENTION

The present invention relates to an electron source, and in particular to an electron source that uses a glow discharge and multiple individually extinguishable electron-emitting apertures to create multiple electron beamlets.

BACKGROUND

Electron lithographic or detection systems typically use a single electron beam to expose or image a substrate. A single beam approach, however, poses severe limitations to the maximum achievable pixel rate, whether used for pixel exposure or pixel detection. In order to satisfy the throughput requirements of present day manufacturing environments several techniques are being developed to increase this pixel rate. For example, one technique used to increase throughput is to increase the number of electron beams that are used for exposure or detection.

In order for such a multiple electron beam system to function properly numerous requirements must be met for each single beam, i.e., each beamlet, as well as the collection of beamlets, i.e., the array. Crucial parameters for each beamlet include, e.g., spot size, brightness, beam uniformity and energy spread, while parameters for the array include uniformity, reliability and manufacturability standards.

In a multi-beam system it is typically desirable to have the ability to individually extinguish each beamlet independently, i.e., blanking a beam. Conventionally, a beam is blanked by shifting the direction of the beam away from a transmission aperture thereby stopping the flow of electrons through the aperture. Electron beamlets, however, propagate in close proximity to each other and, thus, such an approach might be undesirable. The stray electrons created by this type of blanking action could very well disturb the propagation of the neighboring beamlets. It is therefore preferred to extinguish the beamlets at the source thereby preventing any unneeded electrons from entering the optical system.

SUMMARY

A multipixel electron emission device in accordance with the present invention separates a source of electrons from a plasma region. The electron source is contained in an electron source chamber and produces an electron beam that is passed through a wall separating the electron source chamber and the plasma region, e.g., through an entrance aperture. The plasma region, for example, may contain a heavy noble gas, such as Xenon, at low pressure and is surrounded by a high frequency helical coil to produce a plasma. The electron beam enters the plasma region and is diffused in the plasma, which advantageously provides a more uniform energy to the electrons in the electron beam. Moreover, the current of the electron emission device is advantageously controlled by the electron current produced by the electron source and is not limited by the characteristics of the plasma and wall interactions as found in conventional devices. An aperture grid coupled to the plasma region pulls electrons out of the plasma region over a large area thereby producing a broad area electron emission. A focusing chamber is positioned down stream of the plasma region and aperture grid and includes, for example, an multi-beam optical system with beam acceleration grids and deflection devices.

In accordance with an aspect of the present invention, an aperture grid is used as a blanking array. The aperture grid may be used in the above described electron source or may be used in other suitable electron sources. The aperture grid includes a base electrode, which is at a certain potential, and has at least one aperture. A dielectric layer fully or partially overlays the base electrode and surrounds the aperture. A blanker electrode overlays the dielectric layer and also surrounds the aperture. The dielectric layer isolates the blanker electrode from the base electrode. The blanker electrode and base electrode are switchably coupled.

In an "off" state, the blanker electrode is floating, i.e., not coupled to the base electrode, which permits the blanker electrode to become negatively charged from the electron stream that contacts the blanker electrode. Once the blanker electrode is negatively charged, the blanker electrode pinches off the electron stream through the aperture. In an "on" state, the blanker electrode is switchably coupled to the base electrode which drains the negative charge. Thus, the blanker electrode is at the same potential as the base electrode and the electron stream is permitted to pass through the aperture.

The aperture grid may be an integrated blanking and switching device which is manufactured using conventional thin film deposition and patterning techniques. A method of fabricating the integrated blanking and switching device includes providing a conductive substrate, such as a silicon substrate; forming, e.g., a pnp type transistor on the bottom side of the substrate, i.e., on the side that will not be exposed to the plasma region; etching at least one aperture through the substrate so that it extends through the collector of the transistor; depositing and patterning an insulating layer over the substrate so that it surrounds the aperture and covers the sidewalls of the aperture; and depositing and patterning a conductive layer to form a blanker electrode that surrounds the aperture and covers the sidewalls of the aperture. In addition, an inert conductor may be deposited on the top side of the substrate, i.e., the side that will be exposed to the plasma region. The inert conductor can serve as a base electrode or as merely a protective layer that protects the substrate from the glow discharge in the plasma region or electron bombardment from the electron sources. The blanker electrode is coupled to the collector of the pnp type transistor, the emitter is coupled to the conductive substrate and the base is coupled to an external lead and is used to turn on and off the transistor. If desired, additional embedded logic may be included on the aperture grid.

DETAILED DESCRIPTION

In accordance with the present invention, a multipixel electron source uses a glow discharge and an accompanying blanking apparatus which advantageously relaxes the vacuum and cleanliness requirements compared to conventional electron sources. The multipixel electron source draws electrons from a conventional electron source and injects the electrons into a glow discharge region, e.g., a RF glow discharge of a heavy noble gas. The blanking apparatus utilizes the difference in mobility between ions and electrons to achieve the potentials needed to stop the electron flow. These potentials are modulated to achieve control over the electron flow through each aperture of the blanking apparatus, thereby allowing individual control over each beamlet. The blanking apparatus uses low voltage signals to open and close apertures and therefore allows high frequency operation without the need for elaborate electronic circuitry.

Figure 1:
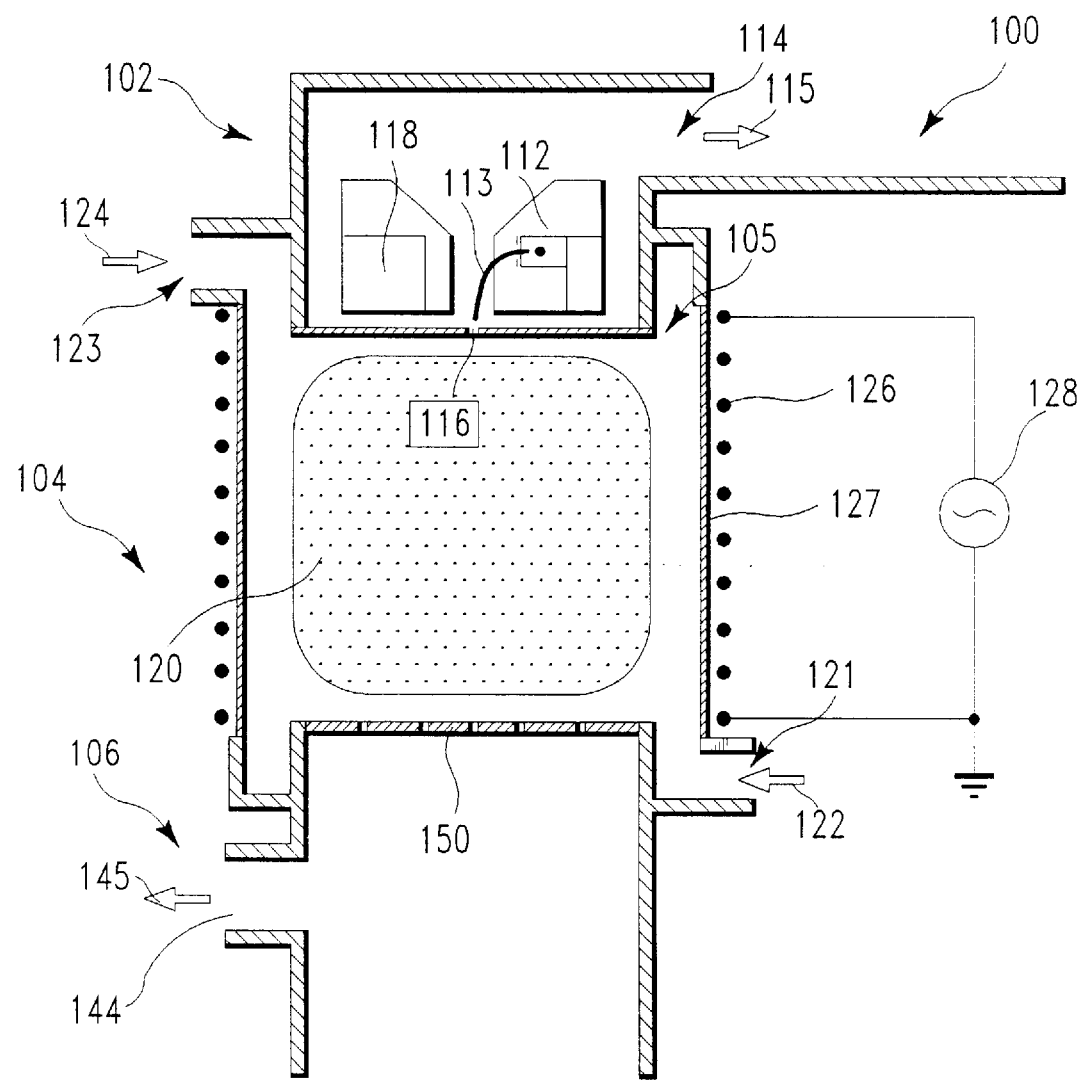
FIG. 1 shows a multipixel electron emission device in accordance with the present invention.

FIG. 1 shows a multipixel electron emission device 100 in accordance with the present invention. As shown in FIG. 1, the multipixel electron emission device 100 is constructed from three distinct sections with vacuum walls having appropriate apertures separating the sections. The first section is the electron source region 102, which is a high vacuum volume that holds a conventional high current electron source. The second section is the glow discharge region 104 of the device, which operates at a higher pressure than the first section. The third section is the focusing region 106, which includes a chamber containing an appropriate multi-beam optical system with, for example, beam acceleration grids and deflection devices.

Electron source region 102 is a chamber that may be formed, e.g., of stainless steel, and maintained at a high vacuum, e.g., $10^{-8}$ Torr, by appropriate pumping via outlet 114, as indicated by arrow 115. Electron source region 102 includes a high current electron source 112, which may be, for example, a tungsten or $LaB_6$ thermionic emitter, that produces an electron beam 113. The requirements for the electron source 112, however, are minimal, and thus, electron source 112 may be any conventional electron source that can deliver high current. The vacuum in electron source region 102 prevents sputtering and extends the life of electron source 112. Electron beam 113 is directed towards an entrance aperture 116 between electron source region 102 and glow discharge region 104 by conventionally deflecting and/or focusing the electron beam 113, e.g., by an appropriately charged plate 118. Electron source 112 produces an electron beam 113 that may have a large energy distribution. For example, an energy distribution of approximately 5 eV is common. The energy distribution of the electrons advantageously will be minimized in the glow discharge region 104.

The entrance aperture 116 between the electron source region 102 and the glow discharge region 104 is sized to create a restriction in the flow of gas from the glow discharge region 104 to the electron source region 102 such that the desired pressures may be maintained in each region without blocking the electron beam 113. By way of example, entrance aperture 116 may be approximately 100 μm to 1000 μm in diameter. Differential pumping or a blocked flow condition in the entrance aperture 116 may be used to maintain the appropriate pressures in the electron source region 102 and the glow discharge region 104.

The glow discharge region 104 is a chamber 105 containing an inductively coupled plasma 120. The glow discharge region 104 chamber is filled with a noble gas, e.g., a heavy noble gas such as Xenon, which is maintained at a low pressure. A desired pressure, e.g., $10^{-3}$ to $10^{-2}$ Torr, is controlled by regulating a low flow of gas into the chamber 105 via aperture 121 and pumping the gas out of the chamber at outlet 123. The flow of gas through the chamber is indicated by arrows 122 and 124.

Chamber 105 includes quartz walls 127 that are surrounded by a helical coil 126. High frequency power, e.g., radio frequency (RF)—MHz to GHz, is applied to helical coil 126 via plasma power supply 128 and a matching network system. The uniformity of the electric field inside the coil 126 will produce a radially uniform inductively coupled plasma 120 and, consequently, a uniform electron density in areas removed from walls 127.

Electron beam 113 enters chamber 120 by way of entrance aperture 116 and passes through the plasma 120. Plasma 120 acts as a conductor. Thus, when electrons within electron beam 113 pass through plasma 120, the electrons will be uniformly distributed. In addition, because plasma 120 is a good conductor, once the electrons enter plasma 120, the electrons will pick up and lose energy thereby greatly reducing the energy distribution in electron beam 113. Thus, the plasma 120 acts as an electron diffuser.

In a conventional system, such as that described in U.S. Pat. No. 4,684,848, the plasma itself is used directly or indirectly to generate the electrons. Consequently, the maximum current that may be delivered from a conventional glow discharge based electron source is limited by the characteristics of the discharge. Multipixel electron emission device 100 advantageously separates the electron source region 102 from the glow discharge region 104. Thus, the maximum current of the electron emission device 100 is independent of the characteristics of plasma 120, and is determined by the maximum electron current of electron source 112. The inductively coupled plasma 120 is used to diffuse the electrons to reduce the energy range of the electrons and to uniformly distribute the electrons over a large area. Thus, electron source 112, which acts as a point source with a poor energy distribution, is converted to a broad area electron source with superior energy distribution.

Once the electrons from electron beam 113 are diffused in plasma 120, the electrons are pulled out by an aperture grid 150. Aperture grid 150 also separates the glow discharge region 104 from the focusing region 106. Aperture grid 150 is an array of closely spaced, small apertures that is used to pull the electrons out of plasma 120. Aperture grid 150 can be used to accelerate, decelerate or blank the electrons exiting the apertures by altering the bias of the aperture grid 150. A blocked flow condition is maintained in each aperture in the aperture grid 150 to maintain the desired pressures in the glow discharge region 104 and the focusing region 106. Each aperture in aperture grid 150 may be, e.g., approximately 10 to 100 μm in diameter and there may be many apertures in aperture grid 150. In one embodiment, there may 1000 apertures or more per square inch. The size and number of apertures is dependent on the trajectory of the electrons as they are pulled out of plasma 120. The operation of aperture grid 150 along with an embodiment of the manufacture of aperture grid 150 is described in further detail below.

Focusing region 106 contains the remainder of the optical system, such as a conventional multi-beam optics system using beam accelerators and deflection devices. The focusing region 106 is kept under a high vacuum by pumping aperture 144, as indicated by arrow 145. Any conventional accelerating and imaging optics capable of focusing multiple pixel electron beams may be used.

Figure 2:
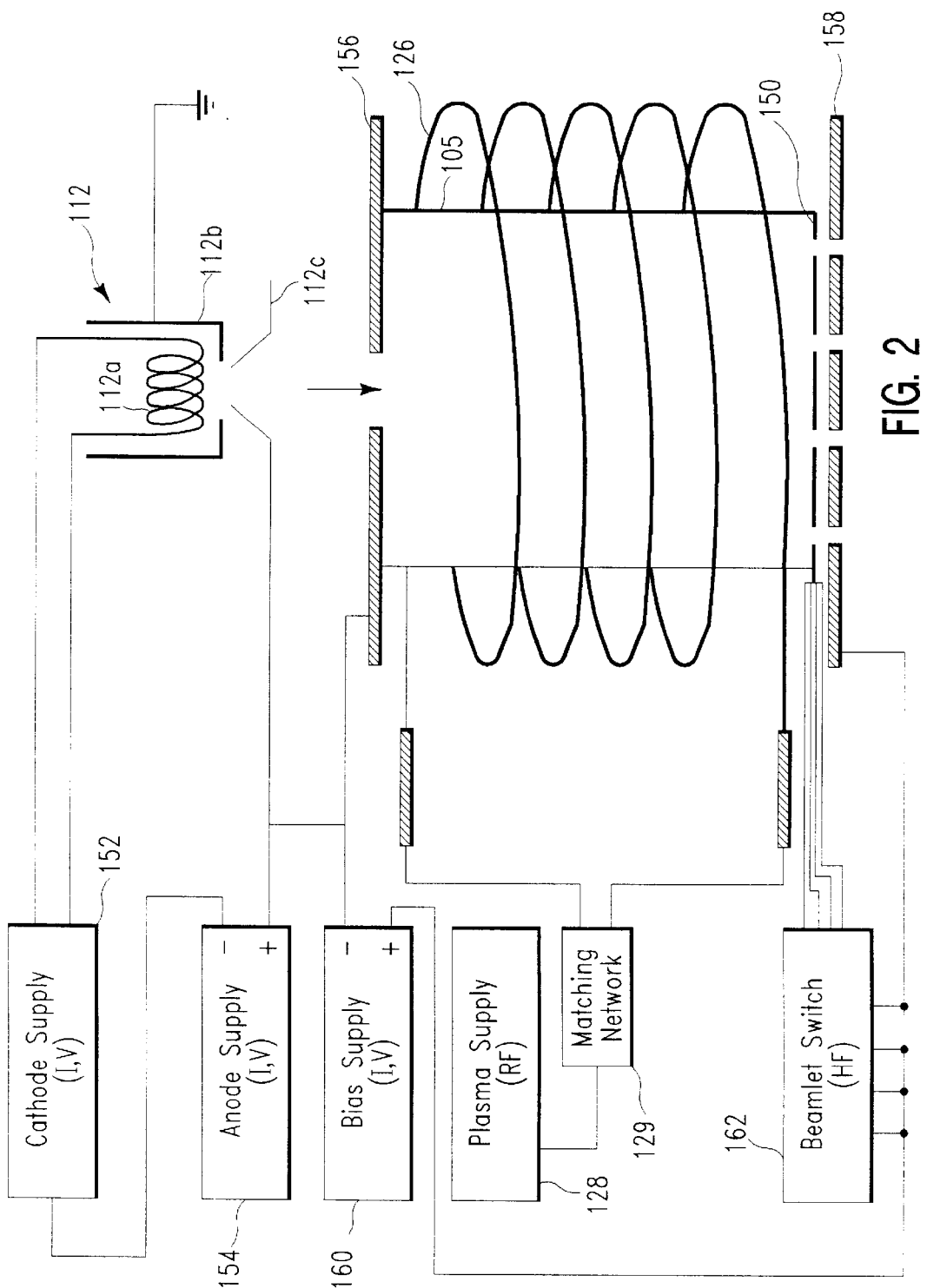
FIG. 2 shows a block diagram view of the electron emission device in accordance with the present invention.

FIG. 2 shows a block diagram view of the electron emission device 100 in accordance with the present invention. As shown in FIG. 2, the electron source 112 is coupled to a cathode supply 152 and an anode supply 154, both of which may be a current or voltage supply. As discussed above, electron source 112 may be a conventional electron source with a filament 112a that is coupled to the cathode supply 152, an extraction electrode 112b coupled to ground, and an anode electrode 112c coupled to the anode supply 154. The glow discharge region 104 chamber 105 includes a top plate 156 and the aperture grid 150 that includes a base electrode 158. The top plate 156 and the base electrode 158 are coupled to a negative and positive terminal, respectively, of a bias supply 160, which supplies a current or voltage. As shown in FIG. 2, in one embodiment, the positive terminal of the anode supply 154 and the negative terminal of the bias supply 160 are coupled together to create a field free region between the anode electrode 112c and the top plate 156.

FIG. 2 shows helical coil 126 around chamber 105. Helical coil 126 is coupled to plasma supply 128, which supplies radio frequency (RF) power via conventional matching network 129.

The bias supply 160 is also coupled to the aperture grid 150 through a high frequency beamlet switch system 162, which controls the individual switching devices of each aperture in aperture grid 150 to open and close each aperture as an individual or as a group of apertures. The opening and closing of each aperture may be controlled, for example, by a microprocessor, digital signal processor or other appropriate device.

If desired, electron emission device 100 may also include a biased screen (not shown) above aperture grid 150. A biased screen may filter out plasma ions before contacting aperture grid 150 while permitting electrons to pass through.

Figure 3:
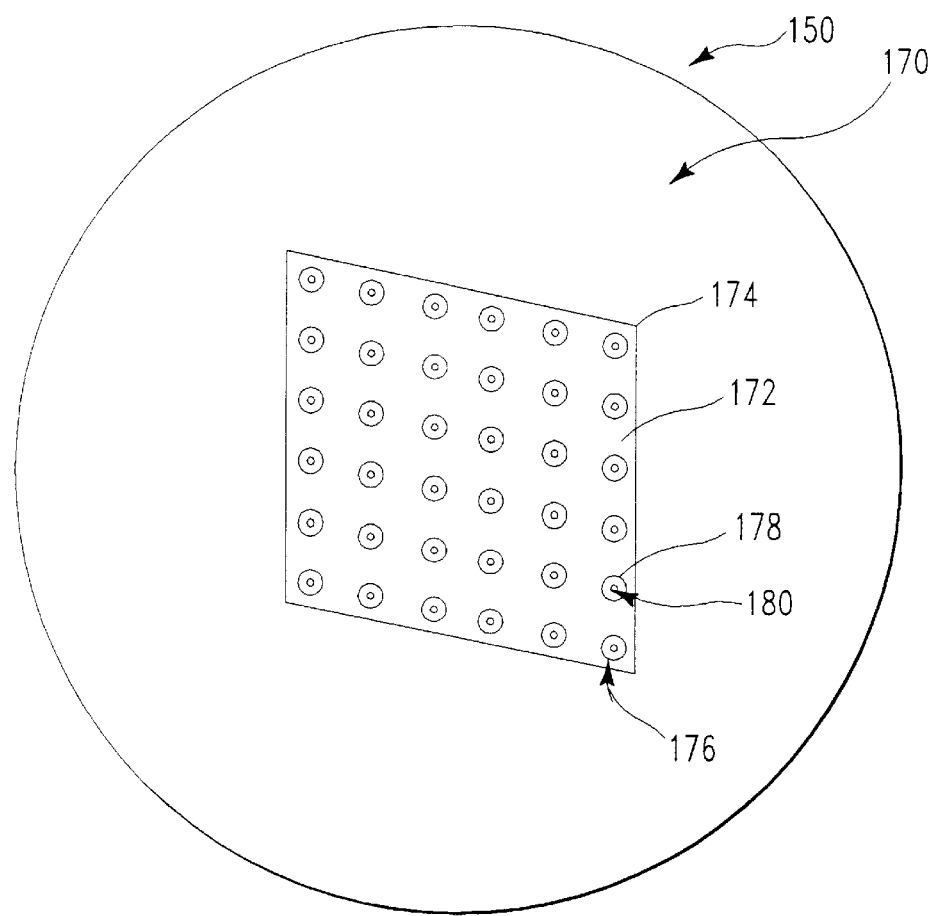
FIG. 3 shows a top view of an aperture grid in accordance with an embodiment of the present invention.

In accordance with an embodiment of the invention, the aperture grid 150 can be used to accelerate, decelerate or blank the electrons exiting the apertures by altering the bias of the aperture grid 150 and by operating individual blanking devices contained in the aperture grid 150 structure. FIG. 3 shows a top view of aperture grid 150 in accordance with an embodiment of the present invention. Aperture grid 150 includes a floating shield 170 and a base electrode 172 separated by insulation 174. Arranged on base electrode 172 is an array of blanking devices 176 that include blanker electrodes 178 having apertures 180 though which individual electron beamlets may travel. The blanker electrode 178 surrounds the aperture 180 and is insulated from the base electrode 172 by a dielectric layer. The base electrode 172 can be biased with different voltages and each blanker electrode 178 can be individually connected through a switching device to the base electrode 172.

Figure 4:
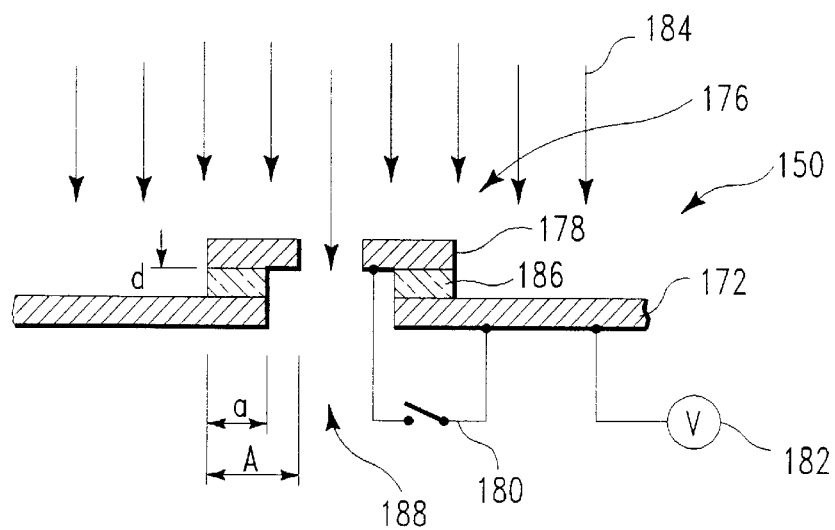
FIG. 4 shows a cross-sectional view of a blanking device on the aperture grid shown in FIG. 3.

FIG. 4 shows a cross-sectional view of a blanking device 176 on aperture grid 150 in accordance with an embodiment of the present invention. Blanking device 176 enables the rapid and independent blanking of exit aperture 180, based on the self-bias generated by the incoming electrons. For a plasma source, the blanking device 176 utilizes the difference in mobility between ions and electrons to achieve the potentials needed to stop the electron flow. These potentials are modulated to achieve control over the electron flow through each aperture of the blanking apparatus, thereby allowing individual control over each beamlet. The blanking device 176 may use low voltage signals to open and close apertures. Thus, blanking device 176 allows high frequency operation without the need for elaborate electronic circuitry. The opening or closing of aperture 180 is achieved by grounding (or increasing the potential) and floating blanker electrode 178, respectively. Advantageously, the potential to drive the blanking of an aperture in aperture grid 150 is independent of the electron energy and is determined only by a switching device used to operate the blanker.

As shown in FIG. 4, blanking device 176 includes base electrode 172 that is coupled to a voltage source 182, which may be, for example, bias supply 160 shown in FIG. 2. Voltage source 182 either grounds or positively biases base electrode 172 to prevent sputtering and to increase electron potential so as to pull electrons (illustrated by arrows 184) out of plasma 120 (shown in FIG. 1). The actual blanking action of blanking device 176 is performed by blanker electrode 178. It should be understood that each aperture in aperture grid 150 includes a separate and independent blanker electrode 178 but shares the same base electrode 172. The blanker electrode 178 is insulated from base electrode 172 by a dielectric 186 but is switchably connected to base electrode 172 by a switch 188.

As illustrated in FIG. 4, blanker electrode 178 overlaps the base electrode 172 with a surface area (illustrated by dimension a), which is a fraction of the total surface area of blanker electrode 178 (illustrated by dimension A). In addition, blanker electrode 178 is separated from base electrode 172 via dielectric 186 by a distance D. The dimensions a, A, and D are parameters that are governed by the speed requirements of the blanker device 176. Dielectric 186 and blanker electrode 178 surround aperture 180.

In the "off" state, the blanker electrode 178 is floating, i.e., is not coupled to base electrode 172. In a floating state, the self bias of the electron source will charge the blanker electrode 178, e.g., by electrons contacting the blanker electrode 178, with a negative potential. Once the blanker electrode 178 is fully charged, the negative potential will prevent electrons from reaching the blanker electrode 178. The presence of the negative potential on blanker electrode 178, which surrounds aperture 180, will pinch off the electron flow through aperture 180. Consequently, aperture 180 is blanked.

In an "on" state, the blanker electrode 178 is electrically coupled to the base electrode 172 by closing switch 188, which will drain the accumulated charge from blanker electrode 178. Thus, the blanker electrode 178 is discharged until it has the same potential as the base electrode 172. Consequently, the pinching field around aperture 180 is removed thereby permitting electrons to pass through aperture 180.

The dimensions (a and A) of blanker electrode 178 may be altered to optimize the characteristic charging and discharging times, i.e., the times to turn "off" and "on". Increasing the total area (A) of blanker electrode 178 will expose a larger area to plasma 120 thereby decreasing the time to charge blanker electrode 178. Increasing the thickness (D) of dielectric 158 and decreasing the non-overlap area (a) will decrease the capacitance of blanker electrode 178. Consequently, the time to reach the "pinch-off" potential will be decreased. The unblanking time is related to the amount of charge on blanker electrode 178 because the "pinch-off" potential must be removed from blanker electrode 178 to unblank aperture 180. Thus, the unblanking time is decreased by storing only a small amount of charge on blanker electrode 178.

Figure 5A:
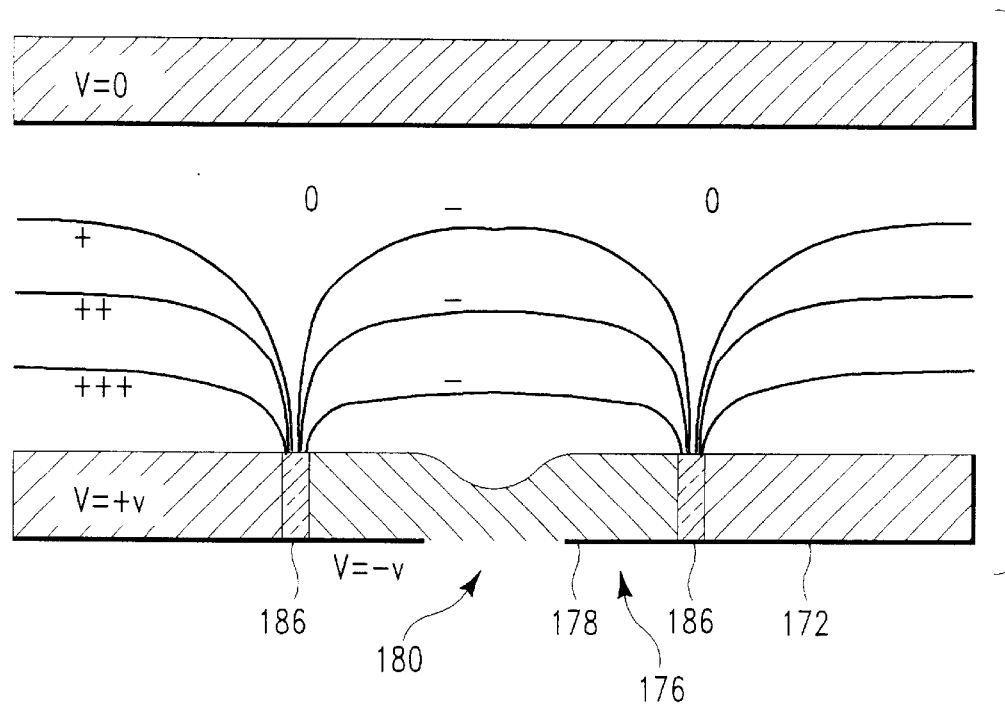
FIGS. 5A and 5B show a qualitative depiction of the equipotential lines in the blanked and unblanked conditions, respectively, of a blanking device in accordance with an embodiment of the present invention.
Figure 5B:
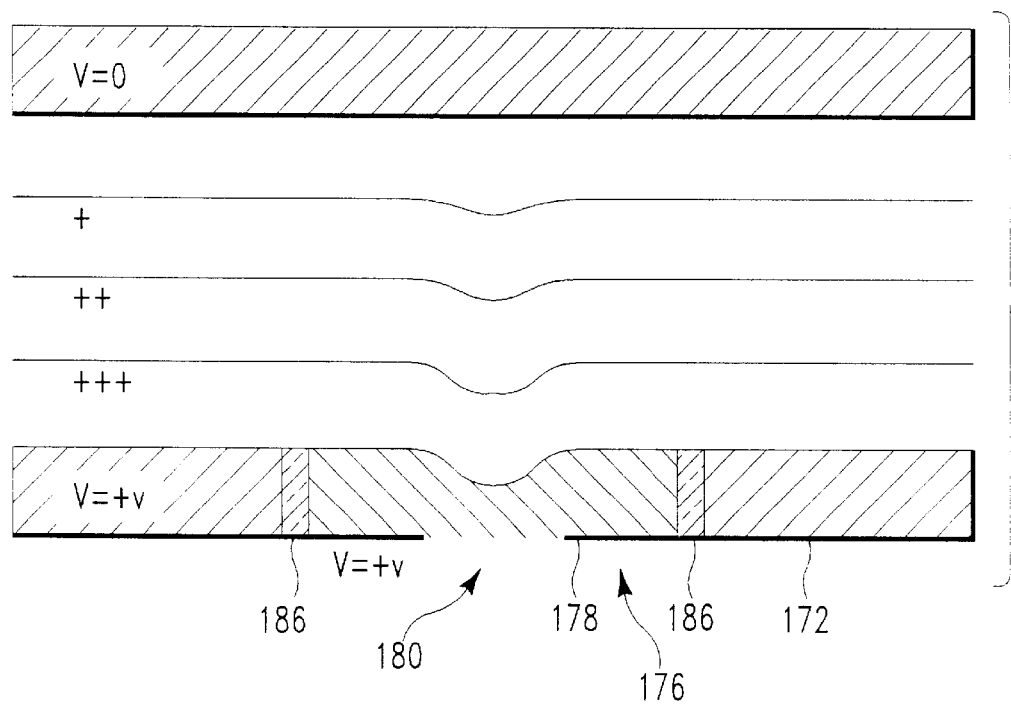

FIGS. 5A and 5B show a qualitative depiction of the equipotential lines in the blanked and unblanked conditions, respectively, of a blanking device 176. As shown in FIG. 5A, in the blanked condition, the blanker electrode 178 is insulated from the base electrode 172 by insulator 186, which permits negative charge to accumulate on blanker electrode 178, i.e., blanker electrode 178 has a voltage V=−v while base electrode has a voltage V=+v. Consequently, a negative field is created around blanker electrode 178. Because electrons are negatively charged, electrons will not pass through the negative field that is created and, thus, aperture 180 is blanked.

As shown in FIG. 5B, when blanking device 176 is unblanked, by electrically coupling blanker electrode 178 to base electrode 172, both blanker electrode 178 and base electrode 172 will have the same voltage V=+v. Thus, electrons will be able to pass through the positive electric field and pass through aperture 180.

Figure 6:
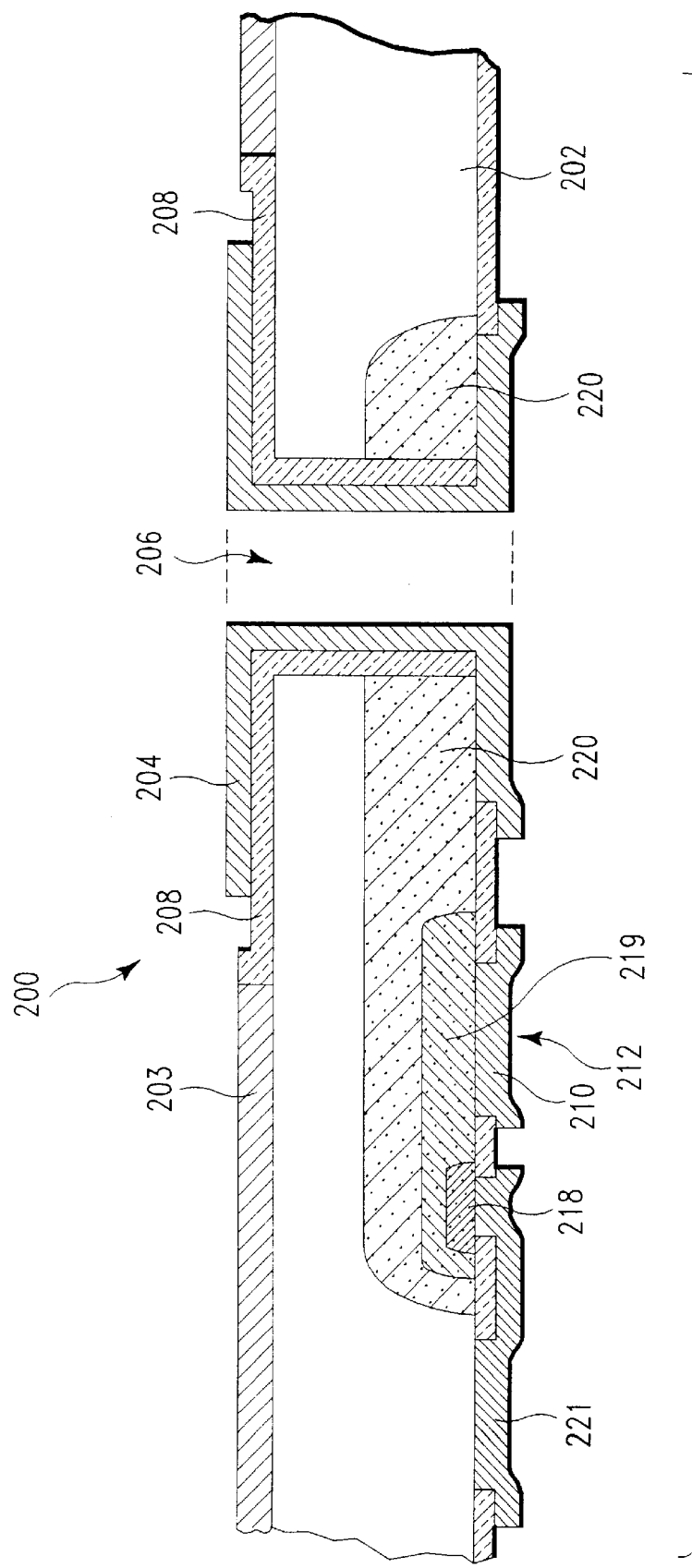
FIG. 6 shows a cross sectional view of one embodiment of an integrated blanking and switching device.

The switch 188 that couples blanker electrode 178 to base electrode 172 may be integrated in accordance with an embodiment of the present invention. FIG. 6 shows a cross sectional view of one embodiment of an integrated blanking and switching device 200. Device 200 is manufactured from a silicon substrate that is overlaid with thin films and patterned to produce the desired switch using conventional thin film deposition and patterning techniques. As shown in FIG. 6, device 200 includes a conductive substrate 202 with an inert conductor 203 (in an embodiment of a non-floating top electrode) and a blanker electrode 204 that surrounds an aperture 206 and that is insulated from the conductive substrate 202 by an insulator 208. The more sensitive components, e.g., the transistor 210 and the switch line 212, are embedded on the back side of the device so as to avoid exposure to the glow discharge. In another embodiment, inert conductor 203 may be replaced with a dielectric material, e.g., insulator 208 may extend over the entire top surface of substrate 202, to provide a floating top electrode. This embodiment may be particularly useful where blanking device 176 is used in an electron beam source that does not use plasma or where the plasma ions are prevented from contacting blanking device 176, e.g., where a biased screen separates plasma ions from an aperture grid 150 that includes blanking devices 176.

FIGS. 7–13 show cross-sectional views of an integrated blanking and switching device in various states of fabrication in accordance with an embodiment of the present invention. The manufacturing of the device may be based on conventional pnp-type transistor fabrication.

Figure 7:
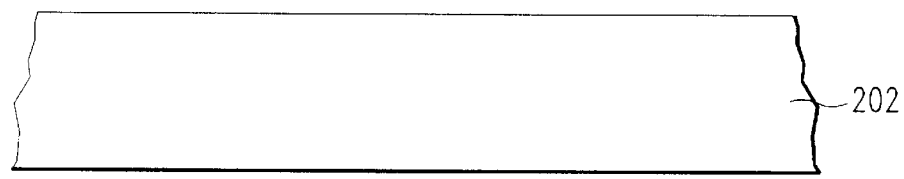
FIGS. 7–13 show cross-sectional views of an integrated blanking and switching device in various states of fabrication in accordance with an embodiment of the present invention.
Figure 8:
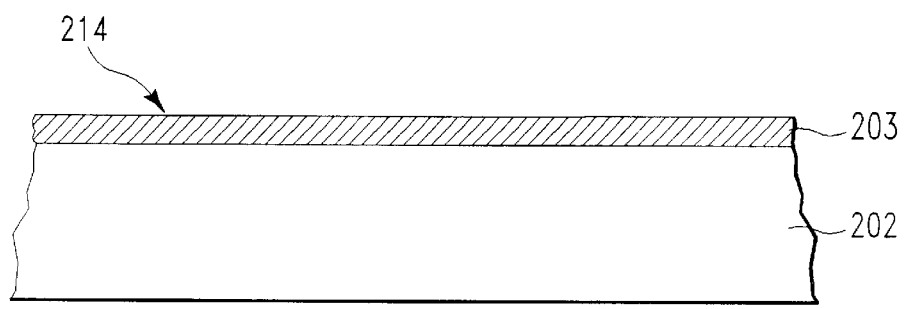

As shown in FIG. 7, a double sided polished n-doped silicon substrate 202 is provided. As shown in FIG. 8, one side 214 of the substrate 202 is coated with a metal or metal compound layer 203 with low sputtering yield to minimize deterioration that will result from exposure to a plasma because side 214 will later be the side that is exposed to the glow discharge. Layer 203 should be resistant to oxidation, and may be, for example, Titanium Nitride (TiN) that is deposited using plasma vapor deposition (PVD). Of course, other suitable materials may be used if desired.

Figure 9:
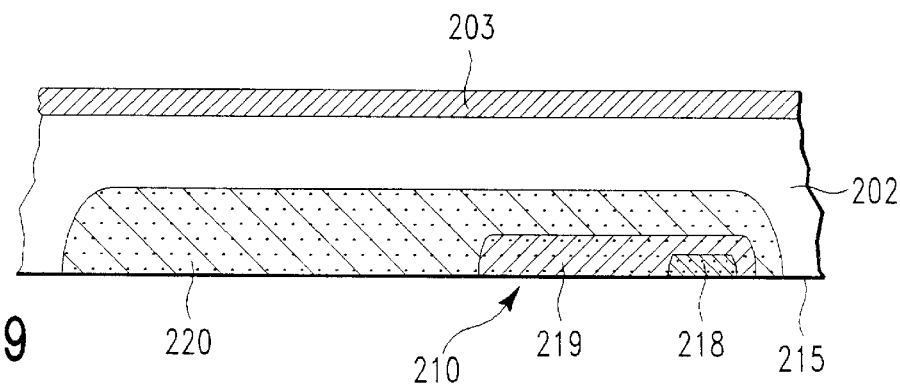

A pnp transistor 210 is produced on the other side 215 of silicon substrate 202 as shown in FIG. 9. Transistor 210 may be conventionally fabricated, as will be well understood by those of ordinary skill in the art, with an emitter 218, a base 219 and a collector 220 that should be large enough to extend around or at least contact the aperture that will be formed. For example, in one embodiment collector 220 may not completely surround the aperture but merely abut the aperture in a limited area.

Figure 10:
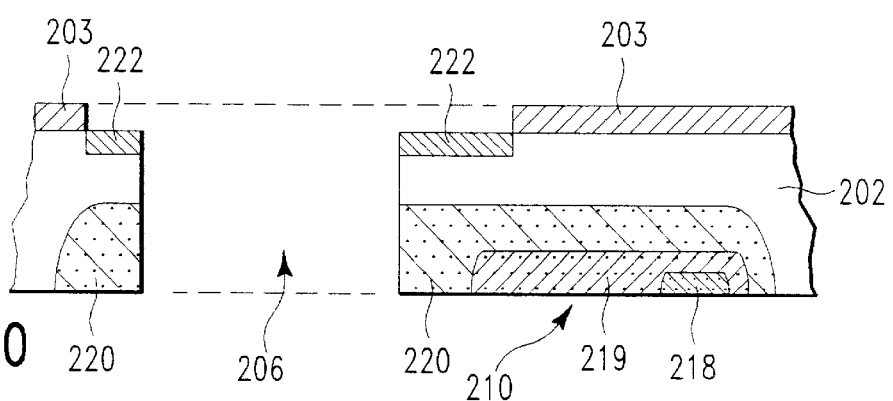

The aperture pattern is etched in the TiN layer 203 so that it lines up with the extended collector 220 of the transistor 210 as shown in FIG. 10. The aperture 206 is then produced in silicon substrate 202 by a deep etch process. The thickness of the aperture 206 may be adjusted by etching silicon substrate 202 around aperture 206 using TiN layer 203 as an etch mask. Thus, for example, a silicon layer 222 may be etched away to decrease the thickness of aperture 206. As shown in FIG. 10, collector 220 surrounds aperture 206.

Figure 11:
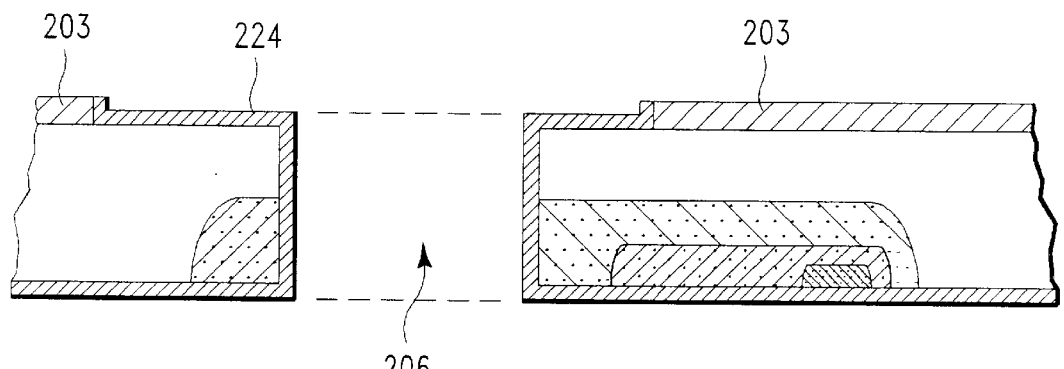

An oxide layer 224, which serves as insulator 208, shown in FIG. 6, is then deposited using, e.g., a wet silicon oxidation process, to a thickness that meets the insulation and capacitance requirements. The oxide layer 224 should be formed such that it covers the sidewalls of aperture 206. Oxide layer 224 does not form over layer 203, because layer 203 is formed from a material, such as TiN, that is resistant to oxidation. The resulting structure is shown in FIG. 11. As described above, if a floating top electrode is desired, oxide layer 224 may be used to completely cover side 114 rather than layer 203.

Figure 12:
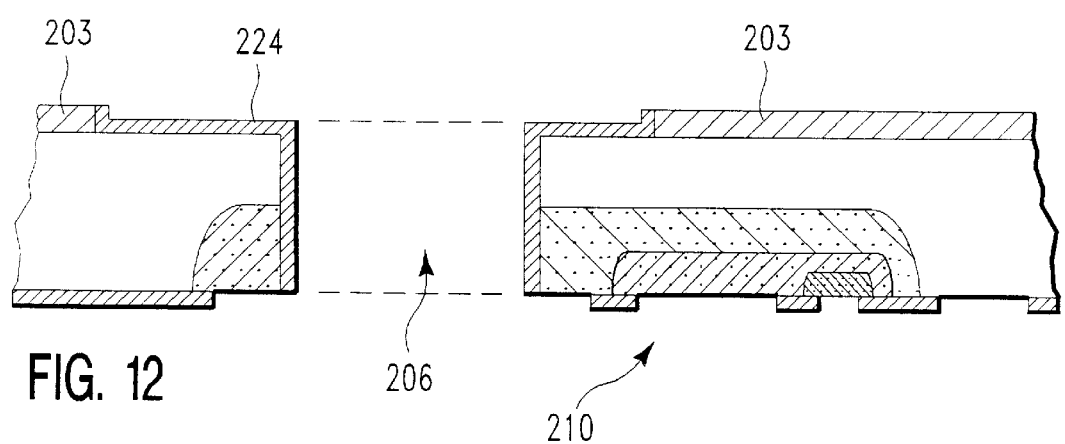
Figure 13:
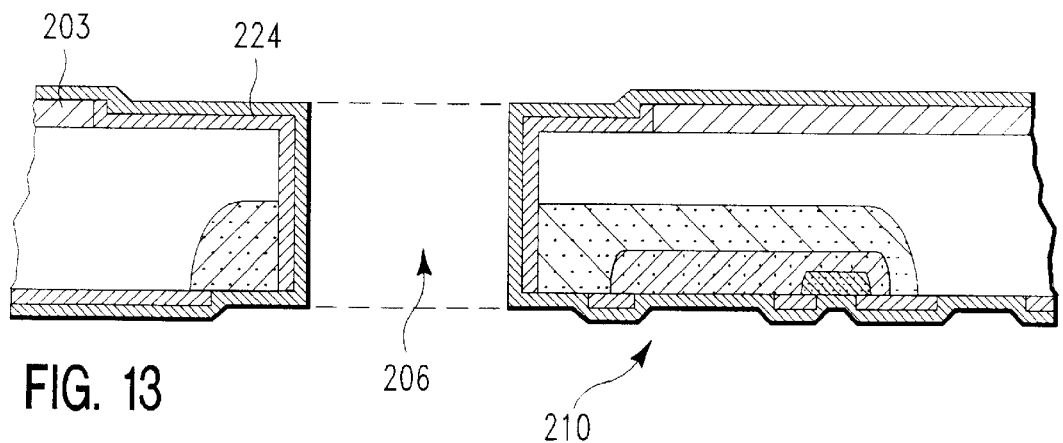

As shown in FIG. 12, the openings for the contacts for transistor 210 are then created, for example, using a dry etching technique so oxide layer 224 on the sidewalls of aperture 206 is maintained.

Both sides 214 and 215 of substrate 202 are then covered with a conductive layer 226 that has a low sputtering yield to avoid future deterioration caused by exposure to a plasma. Layer 226, for example, may be a Tungsten layer which is deposited using chemical vapor deposition. The conductive layer 226 forms the blanker electrode 204 (shown in FIG. 6). Conductive layer 226 may cover the sidewalls of aperture 206.

The conductive layer 226 is then patterned and etched to separate the base, emitter and collector regions of transistor 210 and to form switch line 212 resulting in the structure shown in FIG. 6. The emitter 218 of transistor 210 is coupled to the conductive substrate 202 via a lead 221 formed from conductive layer 226. The collector 220 is coupled to blanker electrode 204. The base 219 contacts switch line 212 which extends to the side of the substrate to allow external control of transistor 210, e.g., via beamlet switch system 162 (shown in FIG. 2). As shown in FIG. 6, conductive layer 226 is also patterned to form blanker electrode 204 which is insulated from the inert conductor 203.

It should be understood that FIG. 6 shows aperture 206 having the same thickness as substrate 202, but if desired, silicon layer 222, shown in FIG. 10, may be etched away to decrease the thickness of aperture 206.

Thus, in accordance with an embodiment of the present invention, aperture grid 150 has a Titanium-Nitride surface, which is exposed to the glow discharge 120, with small apertures which are surrounded by a Tungsten coating. The non-exposed side of aperture grid 150 includes the more sensitive components of the device, include the switching device, i.e., transistor 210 and conductive switching lines. In addition, the aperture grid 150 may also include, for example, on the non-exposed side, embedded logic circuits which may control the aperture grid.

It should be understood that aperture grid 150 is one example of an aperture grid that may be used with electron source device 100. If desired, other aperture grids, including blanking aperture arrays, may be used. Moreover, the use of aperture grid 150 need not be limited only to electron source device 100. Aperture grid 150 may be used with any appropriate charged particle device, for example, a device that includes an electron emitting material, a glow discharge or plasma that can self-bias the blanker electrode 178.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. Thus, the spirit and scope of the appended claims should not be limited to the foregoing description.

What is claimed is:

1. A blanking apparatus for controlling whether or not electrons pass through an aperture, said blanking apparatus comprising:
    a base electrode having at least one aperture, said base electrode having a potential;
    a dielectric layer partially overlaying said base electrode and surrounding said aperture; and
    a blanker electrode overlaying said dielectric layer and surrounding said aperture, said blanker electrode and said base electrode being switchably coupled.

2. The blanking apparatus of claim 1, wherein said blanker electrode partially overlaps said aperture.

3. The blanking apparatus of claim 2, wherein said blanker electrode covers the sidewalls of said aperture.

4. The blanking apparatus of claim 1, wherein said base electrode has a potential provided by a bias supply, said blanker electrode being at approximately the same potential as said base electrode when said switch couples said blanker electrode to said base electrode.

5. The blanking apparatus of claim 4, said blanker electrode is charged with a negative potential when said switch does not couple said blanker electrode to said base electrode.

6. The blanking apparatus of claim 5, said blanker electrode is charged with a negative potential by electrons passing through said blanking aperture.

7. The blanking apparatus of claim 1, wherein said base electrode has a plurality of apertures, each of said plurality of apertures being independently surrounded by a dielectric layer and a blanker electrode, each blanker electrode being independently and switchably coupled to said base electrode.

8. A method comprising:
    providing a potential on a base electrode with an aperture, said potential attracting a stream of electrons;
    insulating a blanker electrode from a base electrode, said blanker electrode surrounding said aperture;
    providing said potential on said blanker electrode to permit said stream of electrons to pass through said aperture; and
    permitting said blanker electrode to become negatively charged by said stream of electrons to pinch off said stream of electrons from passing through said aperture.

9. The method of claim 8, wherein said providing said potential on said blanker electrode comprises switchably coupling said blanker electrode to said base electrode.

10. The method of claim 8, wherein said permitting said blanker electrode to become negatively charged comprises switchably uncoupling said blanker electrode and said base electrode.

11. A method of manufacturing an integrated blanking and switching apparatus, said method comprising:
    providing a conductive substrate having a top side and a bottom side;
    forming a transistor on said bottom side of said substrate, said transistor have a first terminal, a second terminal and a third terminal;
    etching at least one aperture through said substrate, said aperture being etched through said first terminal of said transistor;
    depositing and patterning an insulating layer over said substrate, said insulating layer surrounding said aperture and covering the sidewalls of said aperture; and
    depositing and patterning a conductive layer to form a blanker electrode surrounding said aperture, and to couple said second terminal of said transistor to said conductive substrate, and to couple said third terminal of said transistor to an external lead to turn on and off said transistor, said blanker electrode being switchably coupled to said conductive substrate through said first terminal of said transistor.

12. The method of claim 11 further comprising depositing an inert conductor layer on said top side of said substrate.

13. The method of claim 11, wherein said conductive substrate is doped with an n type dopant.

14. The method of claim 13, wherein said transistor is an pnp transistor.

15. The method of claim 11, wherein said conductive layer is patterned to form said blanker electrode surrounding said aperture and on said sidewalls of said aperture.

16. An electron emission apparatus comprising:
    an electron source chamber having an electron source producing an electron beam;
    a plasma region in communication with said electron source chamber through an entrance aperture in a wall between said electron source chamber and a plasma chamber, said plasma chamber containing a plasma, said plasma diffusing said electron beam; and
    an aperture grid coupled to said plasma region, said aperture grid separating diffused electrons into individual electron beamlets, said aperture grid being a blanking aperture array with a bias voltage to pull electrons out of said plasma region to form said individual electron beamlets, wherein individual apertures within said blanking aperture array are blanked from the self bias of the electrons producing a negative field around said individual apertures.

17. The apparatus of claim 16, further comprising a focusing chamber coupled to said plasma region, said aperture grid disposed between said focusing chamber and said plasma region, said focusing chamber having a multi-beam optical system for focusing said electron beamlets.

18. The apparatus of claim 16, wherein said electron source chamber and said plasma region are at different pressures.

19. The apparatus of claim 16, wherein said plasma region comprises:
    a plasma chamber having a low pressure noble gas;
    a helical coil around said plasma chamber, said helical coil being coupled to
    a power source that supplies radio frequency power to said helical coil.

20. The apparatus of claim 19, wherein said noble gas is a heavy noble gas.

21. The apparatus of claim 20, wherein said noble gas is Xenon.

22. The apparatus of claim 16, wherein said plasma chamber has walls comprising quartz.

23. A method of producing a multipixel electron emission, said method comprising:
    producing an electron beam;
    generating a plasma;
    passing said electron beam through said plasma to diffuse electrons in said electron beam;
    pulling said electrons out of a plasma region into individual electron beamlets;
    blanking individual electron beamlets by permitting a negative field to accumulate on a blanker electrode around apertures through which said individual electron beamlets pass, said negative field being produced by electrons charging said blanker electrode; and unblanking individual electron beamlets by draining the charge accumulated on said blanker electrode.

24. The method of claim 23, wherein said producing an electron beam comprises producing a beam of electrons from an electron source.

25. The method of claim 23, wherein generating a plasma comprises:

providing a noble gas within a plasma chamber; and providing a high frequency current in a coil around said plasma chamber.

26. The method of claim 23, further comprising:

directing said electron beam through an aperture in a wall separating an electron source and said plasma.

27. The method of claim 23, wherein said pulling said electrons out of said plasma region comprises placing a bias voltage on an aperture grid, said bias voltage attracting said electrons.

28. The method of claim 23, further comprising altering the current of the electron emission by altering the electron current of said electron beam.

* * * * *